(12) United States Patent
Jung et al.

(10) Patent No.: US 11,482,413 B2
(45) Date of Patent: Oct. 25, 2022

(54) CONFORMAL AND SMOOTH TITANIUM NITRIDE LAYERS AND METHODS OF FORMING THE SAME

(71) Applicant: Eugenus, Inc., San Jose, CA (US)

(72) Inventors: Sung-Hoon Jung, Santa Clara, CA (US); Niloy Mukherjee, San Ramon, CA (US); Yoshikazu Okuyama, Santa Cruz, CA (US); Nariman Naghibolashrafi, San Jose, CA (US); Bunsen B. Nie, Fremont, CA (US); Hae Young Kim, San Jose, CA (US); Somilkumar J. Rathi, San Jose, CA (US)

(73) Assignee: Eugenus, Inc., San Jose, CA (US)

( * ) Notice: Subject to any disclaimer, the term of this patent is extended or adjusted under 35 U.S.C. 154(b) by 0 days.

(21) Appl. No.: 16/595,945

(22) Filed: Oct. 8, 2019

(65) Prior Publication Data
US 2021/0104396 A1    Apr. 8, 2021

(51) Int. Cl.
*H01L 21/02* (2006.01)
*C23C 16/34* (2006.01)
(Continued)

(52) U.S. Cl.
CPC .......... *H01L 21/0228* (2013.01); *C23C 16/34* (2013.01); *C23C 16/45527* (2013.01);
(Continued)

(58) Field of Classification Search
CPC .......... H01L 21/0228; H01L 21/02211; H01L 21/0254; H01L 21/28194; C23C 16/34; C23C 16/45527
See application file for complete search history.

(56) References Cited

U.S. PATENT DOCUMENTS 7,732,350 B2   6/2010   Hasper et al.
10,388,513 B1  8/2019   Blanquart
(Continued)

OTHER PUBLICATIONS

Kaizuka et al., "Conformal Chemical Vapor Deposition TiN(111) Film Formation as an Underlayer of Al for Highly Reliable Interconnects", Jpn. J. Appl. Phys. Vol. 33, pp. 470-474, Part 1, No. 1B, Jan. 1994.

(Continued)

*Primary Examiner* — Kelly M Gambetta
(74) *Attorney, Agent, or Firm* — Knobbe Martens Olson & Bear, LLP

(57) ABSTRACT

The disclosed technology generally relates to forming a thin film comprising titanium nitride (TiN), and more particularly to forming by a cyclical vapor deposition process the thin film comprising (TiN). In one aspect, a method of forming a thin film comprising TiN comprises exposing a semiconductor substrate to one or more first cyclical vapor deposition cycles each comprising an exposure to a first Ti precursor and an exposure to a first N precursor to form a first portion of the thin film and exposing the semiconductor substrate to one or more second cyclical vapor deposition cycles each comprising an exposure to a second Ti precursor and an exposure to a second N precursor to form a second portion of the thin film, wherein exposures to one or both of the first Ti precursor and the first N precursor during the one or more first cyclical vapor deposition cycles are at different pressures relative to corresponding exposures to one or both of the second Ti precursor and the second N precursor during the one or more second cyclical vapor deposition cycles. Aspects are also directed to semiconductor structures incorporating the thin film and method of forming the same.

23 Claims, 11 Drawing Sheets

(51) Int. Cl.
*C23C 16/455* (2006.01)
*H01L 21/28* (2006.01)
(52) U.S. Cl.
CPC .... *H01L 21/0254* (2013.01); *H01L 21/02211* (2013.01); *H01L 21/28194* (2013.01)

(56) References Cited

U.S. PATENT DOCUMENTS

| | | | |
|---|---|---|---|
| 2004/0013803 | A1 | 1/2004 | Chung et al. |
| 2005/0042865 | A1 | 2/2005 | Cabral, Jr. et al. |
| 2008/0274616 | A1 | 11/2008 | Hasegawa |
| 2008/0305561 | A1 | 12/2008 | Govindarajan |
| 2011/0031593 | A1* | 2/2011 | Saito .............. C23C 16/45544 257/632 |
| 2011/0256734 | A1 | 10/2011 | Hausmann et al. |
| 2014/0120737 | A1* | 5/2014 | Swaminathan ..... C23C 16/4554 438/765 |
| 2019/0304790 | A1* | 10/2019 | Mousa ............... H01L 21/0228 |

OTHER PUBLICATIONS

Li et al, "Grain boundary structures of atomic layer deposited TiN", Thin Solid Films 504 (2006), pp. 108-112.
International Search Report and Written Opinion dated Dec. 10, 2020 in Application No. PCT/US2020/050627.
H.C.M. Knoops, et al., "Atomic Layer Deposition," Ch. 27, 2015, pp. 1101-1134 in Handbook of Crystal Growth, edited by T. Kuech (Elsevier, 2015).
Juppo, Marika, "Atomic Layer Deposition of Metal and Transition Metal Nitride Thin Films and In Situ Mass Spectrometry Studies," 2001, pp. 1-65.
Knez, Mato, "Diffusion phenomena in atomic layer deposition," Jun. 22, 2019, pp. 2-9, IOP Publishing Ltd, UK & USA.
Leskela, Markku et al., "Atomic layer deposition (ALD): from precursors to thin film structures (article), " Apr. 22, 2002, pp. 138-146, vol. 409—Issue 1 2002 Elsevier Science B.V., Helsinki, Finland.
Lucero, Antonio T., et al., "Silicon Nitride Atomic Layer Deposition: A Brief Review of Precursor Chemistry," Material Matters 2018, pp. 1-7, Sigma-Aldrich.
Meng, Xin et al., "Atomic Layer Deposition of Silicon Nitride Thin Films: A Review of Recent Progress, Challenges, and Outlooks," Dec. 12, 2016, pp. 1-20, MDPI Journals.
Mühlbacher, Marlene, "High-resolution characterization of TiN diffusion barrier layers," 2015, pp. 1-76, Linköping, Sweden.
Musschot, J., et al., "Atomic layer deposition of titanium nitride from TDMAT precursor," Oct. 2, 2008, pp. 1-8, Microelectronic Engineering vol. 86—Issue 1, 2008, p. 72-77, Elsevier B.V.
Xie, Siyi et al., "Properties and Morphology of TiN Film Deposited by Atomic Layer Deposition," Apr. 2014, pp. 144-149, vol. 19—Issue 2, Beijing, China.
International Search Report and Written Opinion dated Mar. 2, 2022 in Application No. PCT/US2021/062679 in 19 pages.
Invitation to Pay Additional Fees and, Where Applicable, Protest Fee dated May 9, 2022 in International Application No. PCT/US2022/071227 in 2 pages.
International Preliminary Report on Patentability dated Apr. 21, 2022 in Application No. PCT/US2020/050627 in 11 pages.

\* cited by examiner

CONFORMAL AND SMOOTH TITANIUM NITRIDE LAYERS AND METHODS OF FORMING THE SAME

BACKGROUND

Field

The disclosed technology generally relates to forming a titanium nitride layer, and more particularly to a conformal and smooth titanium nitride layer.

Description of the Related Art

Titanium nitride (TiN) has been widely used in fabrication of various structures in integrated circuits (ICs). For example, TiN has been used in diffusion barriers, various electrodes and metallization structures. Such wide usage of TiN in IC fabrication can be attributed to its structural, thermal and electrical properties. As the dimensions of various IC structures shrink, TiN is formed on features having increasingly smaller dimensions and complex topologies. For example, as the technology node scales to 10 nm node and beyond, there is a need for TiN layers, e.g., as diffusion barriers, that can conformally line high aspect ratio trenches and vias having dimensions as small as few nanometers. While techniques such as physical vapor deposition (PVD) and chemical vapor deposition (CVD) have been used in the IC industry to form TiN for decades, the increased need for conformality of TiN films to be deposited in smaller trenches or vias may eventually limit their usage. On the other hand, while atomic layer deposition (ALD) has been demonstrated for conformal deposition of TiN films, some electrical properties (e.g., conductivity) and physical properties (e.g., surface roughness) of the film may be inferior compared to TiN films formed using other methods such as physical vapor deposition (PVD). Thus, there is a need for atomic layer deposition methods for forming TiN-based films with superior surface smoothness and step coverage, while also having matching or superior electrical and physical properties, relative to TiN films formed by PVD and CVD, for use in IC fabrication.

SUMMARY

In one aspect, a method of forming a thin film comprising titanium nitride (TiN) by a cyclical vapor deposition process comprises forming on a semiconductor substrate a first portion of the thin film by exposing the semiconductor substrate to one or more first cyclical vapor deposition cycles each comprising an exposure to a first Ti precursor and an exposure to a first N precursor. The method additionally comprises forming on the first portion of the thin film a second portion of the thin film by exposing the semiconductor substrate to one or more second cyclical vapor deposition cycles each comprising an exposure to a second Ti precursor and an exposure to a second N precursor. The exposures to one or both of a Ti precursor and a N precursor during the one or more second ALD cycles are at higher pressures relative to corresponding exposures to one or both of the Ti precursor and the N precursor during the one or more first ALD cycles.

In another aspect, a method of forming a thin film comprising titanium nitride (TiN) by a cyclical vapor deposition process comprises providing a semiconductor substrate comprising a trench or a via having an aspect ratio exceeding 1. The method additionally comprises forming the thin film in the trench or the via by exposing the semiconductor substrate to one or more first cyclical vapor deposition cycles each comprising an exposure to a first Ti precursor and an exposure to a first N precursor to form a first portion of the thin film in the trench or the via. The method additionally comprises exposing the semiconductor substrate to one or more second cyclical vapor deposition cycles each comprising an exposure to a second Ti precursor and an exposure to a second N precursor to form a second portion of the thin film on the first portion of the thin film. Exposures to one or both of the first Ti precursor and the first N precursor during the one or more first cyclical vapor deposition cycles are at different pressures relative to corresponding exposures to one or both of the second Ti precursor and the second N precursor during the one or more second cyclical vapor deposition cycles.

In another aspect, a semiconductor structure comprises a semiconductor substrate comprising a non-metallic sidewall surface in a trench or a via having an aspect ratio exceeding 5. The semiconductor structure additionally comprises a thin film comprising TiN conformally coating the non-metallic sidewall surface, wherein a ratio of thicknesses of the thin film on formed lower 25% of a height of the trench or the via and upper 25% of the height of the trench or the via exceeds 0.9.

DETAILED DESCRIPTION

Figure 1:
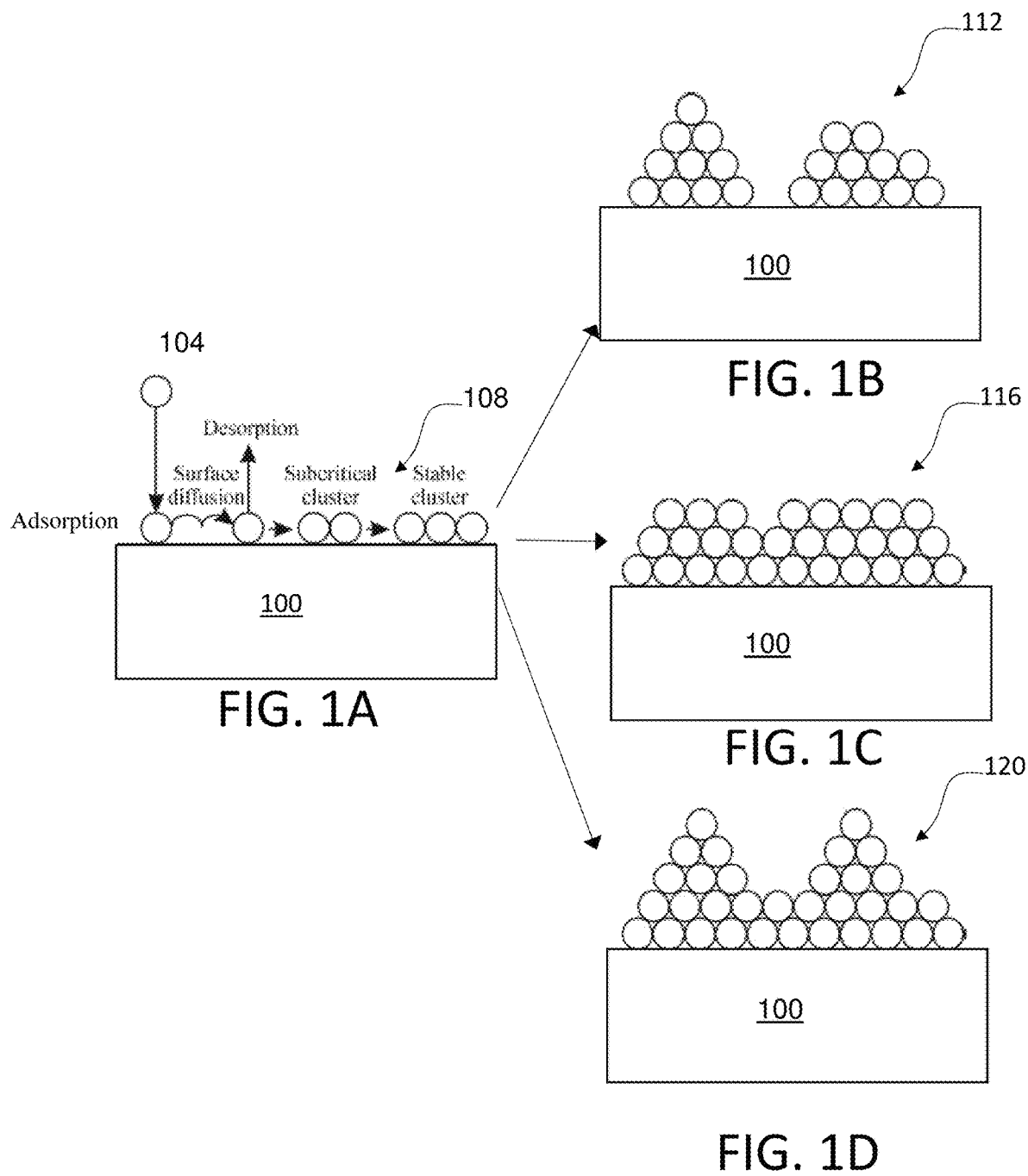
FIGS. 1A-1D schematically illustrate nucleation and growth mechanisms of thin films under different growth modes.

As described above, there is a need in the integrated circuit (IC) industry for smooth and conformal TiN films with superior electrical and physical properties, as well as methods of forming such films. To address these and other needs, disclosed herein is a smooth and conformal thin film comprising TiN and a cyclical vapor deposition method of forming the thin film, which displays the conformality characteristic of a film deposited by cyclical vapor deposition processes, while also having electrical and physical properties that are superior or matching those of TiN films formed by existing physical vapor deposition (PVD) and chemical vapor deposition (CVD) methods. In particular, a method of forming a thin film comprising titanium nitride (TiN) comprises forming on a semiconductor substrate a first portion of the thin film by exposing the semiconductor substrate to one or more first cyclical vapor deposition cycles each comprising an exposure to a first Ti precursor and an exposure to a first N precursor. The method additionally comprises forming on the first portion of the thin film a second portion of the thin film by exposing the semiconductor substrate to one or more second cyclical vapor deposition cycles each comprising an exposure to a second Ti precursor and an exposure to a second N precursor. The exposures to one or both of the second Ti precursor and the second N precursor during the one or more second cyclical vapor deposition cycles are different compared to corresponding exposures to one or both of the first Ti precursor and the first N precursor during the one or more first cyclical vapor deposition cycles. The cyclical vapor deposition processes disclosed herein are sometimes referred to as atomic layer deposition (ALD). However, cyclical vapor deposition processes are not limited to atomic layer deposition processes. For example, the precursors may partly or substantially saturate a reaction surface in various embodiments described herein.

By exposing the substrate to the Ti and/or N precursors at relatively low pressures, e.g., less than 3 torr, during deposition of the first portion of the thin film, the initial film growth may proceed substantially in a layer-by-layer growth mode, which advantageously results in an average grain size that lower and a surface roughness that is lower relative to a comparable TiN film that is deposited by exposing the substrate to the Ti and/or N precursors at higher pressures, e.g., greater than 3 torr or 5 torr. On the other hand, by exposing the substrate to the Ti and/or N precursors at relatively high pressures, e.g., greater than 3 torr, during deposition of the second portion of the thin film, the latter portion of the film growth advantageously results in a degree of conformality or a step coverage that is higher relative to a comparable TiN film that is deposited by exposing the substrate to the Ti and/or N precursors at the relatively low pressures, e.g., less than 3 torr or less than 1 torr.

In addition, because the first portion of the TiN film grows in a layer-by-layer mode, the second portion of the thin film may continue to grow, using the first portion as a template, in a layer-by-layer mode compared to a comparable thin film grown starting with exposures to the Ti and/or N precursors at relatively higher pressures.

As a net result, when deposited on certain surfaces, e.g., a surface comprising a non-metallic surface, the thin film comprising the first and second portions deposited by depositing at two different corresponding exposure pressures for one or both of the Ti precursor and the N precursor according to methods disclosed herein advantageously has a combination of surface roughness and conformality that is superior relative to a thin film layer formed on the same surface using a single pressure. Alternatively, or in addition, in part owing to the improved smoothness and conformality, the thin film has a relatively low electrical resistivity compared to TiN layers formed by some existing methods.

As described herein, a compound referred to by its constituent elements without specific stoichiometric ratios thereof shall be understood to encompass all possible non-zero concentrations of each element unless explicitly limited. For example, titanium nitride (TiN) shall be understood to encompass all possible stoichiometric and nonstoichiometric compositions of titanium nitride that can be expressed by a general formula $Ti_xN$, where x>0, including TiN, $Ti_3N_4$, $Ti_4N_3$, $Ti_6N_5$, $Ti_2N$ and $TiN_2$ as well as other non-stoichiometric compositions of Ti and N.

As described above, titanium nitride (TiN) plays an important role in integrated circuit (IC) fabrication. While techniques such as physical vapor deposition (PVD) and chemical vapor deposition (CVD) have been used in the IC industry to deposit TiN, the need for deposition methods for forming TiN-based films having high conformality without significant compromise in electrical and physical properties has been increasing.

In addition, while plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma or its actives species may not reach deeper portions of high aspect ratio vias under some circumstances. In these circumstances, different portions of vias may be exposed to different amounts of the plasma or its active species, leading to undesirable structural effects of non-uniform deposition, such as thicker films being deposited near the opening of the via compared to deeper portions (sometimes called cusping or keyhole formation). For these reasons, thermal ALD may be more advantageous, because thermal ALD does not depend on the ability of the plasma or its active species to reach portions of the surface being deposited on.

However, while thermal ALD techniques may be suitable for forming relatively conformal TiN films on topography, particularly topography with relatively high aspect ratios (e.g., over 1:1), the inventors have recognized that TiN films formed by thermal ALD can be inferior to TiN films formed by PVD or CVD in some respects, e.g., film roughness and electrical resistivity. In this regard, the inventors have discovered that some electrical properties and/or physical properties of ALD-grown TiN-based films can be affected by the mode of growth. In particular, the inventors have discovered that, while it may be desirable to grow the TiN-based films in a two-dimensional layer-by-layer growth mode in ALD, such layer-by-layer growth mode may not be easily achieved under some circumstances. The inventors have further discovered that growing TiN-based films by ALD in a layer-by-layer growth mode poses a particular challenge in IC fabrication where the TiN-based films are formed on non-metal surfaces, such as insulating surfaces, such as oxide and nitride surfaces or semiconductor surfaces such as doped and undoped silicon surfaces. The inventors have recognized that the degree to which the TiN-based films may be grown in a layer-by-layer growth mode may in turn be dependent on the initial growth mode that is dependent on the type of surface, as described herein without being bound to any theory, in reference to FIGS. 1A-1D.

FIG. 1A schematically illustrates nucleation of a TiN layer and FIGS. 1B-1D illustrate different growth modes of the TiN layer on different surfaces. Referring FIG. 1A, once precursor molecules 104 reach the surface of a substrate 100, they become physically adsorbed thereon. Some of the adsorbed molecules 104 may diffuse along the surface of the substrate 100 until they reach an energetically favorable position to be chemisorbed. The surface diffusion is governed by, among other things, the substrate temperature, the substrate material and kinetic energy of the adsorbed molecules. When the size of a nuclei formed by chemisorbed molecules exceeds a certain size (sometimes referred to as "critical size") determined by the trade-off between volume free energy and surface energy, the nuclei may become energetically stable, and start to grow in size. Thus formed layer 108 of stable nuclei continue to grow by incorporating additional precursor molecules 104. Subsequent film growth can be classified according to different growth modes, schematically illustrated in FIGS. 1B-1D.

FIG. 1B schematically illustrates a three-dimensional island growth mode, sometimes referred to as Volmer-Weber growth mode, which results in the formation of a layer 112 of three-dimensional islands. Without being bound to any theory, the island growth mode can dominate when the net surface free energy associated with three-dimensional islands is positive, indicating that deposited atoms are more strongly bound to each other than to the substrate. It will be appreciated that the energetics of ALD growth of TiN layers can favor the island growth mode, e.g., when the metallic TiN layers are deposited on some semiconductor and/or insulating material surfaces.

FIG. 1C illustrates a layer-by-layer growth mode, sometimes referred to as Frank-van der Merwe growth mode, which results in the formation of a relatively smooth two-dimensional layer 116. Without being bound to any theory, the layer-by-layer growth mode can dominate when the deposited atoms are more strongly bound to the substrate than to each other, such that a stable two-dimensional layer 116 is energetically favored. The layer-by-layer growth mode can be sustained when there is a continuous decrease in bonding energy between the layers from the first monolayer to the bulk-crystal value of the TiN layer.

While FIGS. 1B and 1C are two different possible growth modes of thin films, it will be appreciated that, under some circumstances, a growth mode that is intermediate between a layer-by-layer growth mode and a three-dimensional growth mode is possible. FIG. 1D illustrates an example of an intermediate growth mode known as Stranski-Krastanov (SK) growth mode. Without being bound to any theory, the SK growth may occur in thin film growth that commences in a layer-by-layer mode. When layer-by-layer growth becomes unfavorable after the formation of one or more monolayers, an island growth mode starts to dominate over a layer-by-layer growth mode, resulting in thin film structure 120 in which three dimensional islands are formed on a two-dimensional initial layer. The SK growth mode can occur as a strain relaxation mechanism (strain-induced roughening).

In addition to the interaction between the deposit and the substrate, other factors such as the substrate temperature, reactor pressure and deposition rate can significantly affect the nucleation and early growth processes, which in turn affects the final nanostructure or microstructure of the resulting thin film. For example, deposition conditions that enhance surface diffusion, e.g., relatively high substrate temperatures, relatively low pressures and/or low deposition rates may promote the growth in a layer-by-layer mode. Hence, as disclosed herein, by enhancing surface diffusion during deposition of an initial portion of a TiN film by, e.g., lowering pressure and growth rate, the initial film growth according to embodiments may proceed substantially in a layer-by-layer growth mode.

It has been discovered that, when TiN is grown by ALD on various surfaces of interest in IC fabrication, such as dielectric and semiconductor surfaces, the ALD growth initializes in a three-dimensional island growth mode or a SK growth mode. For example, under some circumstances, ALD growth of TiN on substrate surfaces, including doped and undoped Si, $SiO_2$, $Si_3N_4$ and other high K or low K materials, may proceed in an island growth mode or the SK growth mode. The inventors have discovered that, in part owing to the initial growth mode of either an island or SK growth mode, subsequent growth of TiN by ALD often results in a film morphology that is undesirable for various applications of ultrathin conformal TiN for high aspect ratio structures, as illustrated in FIG. 2.

Figure 2:
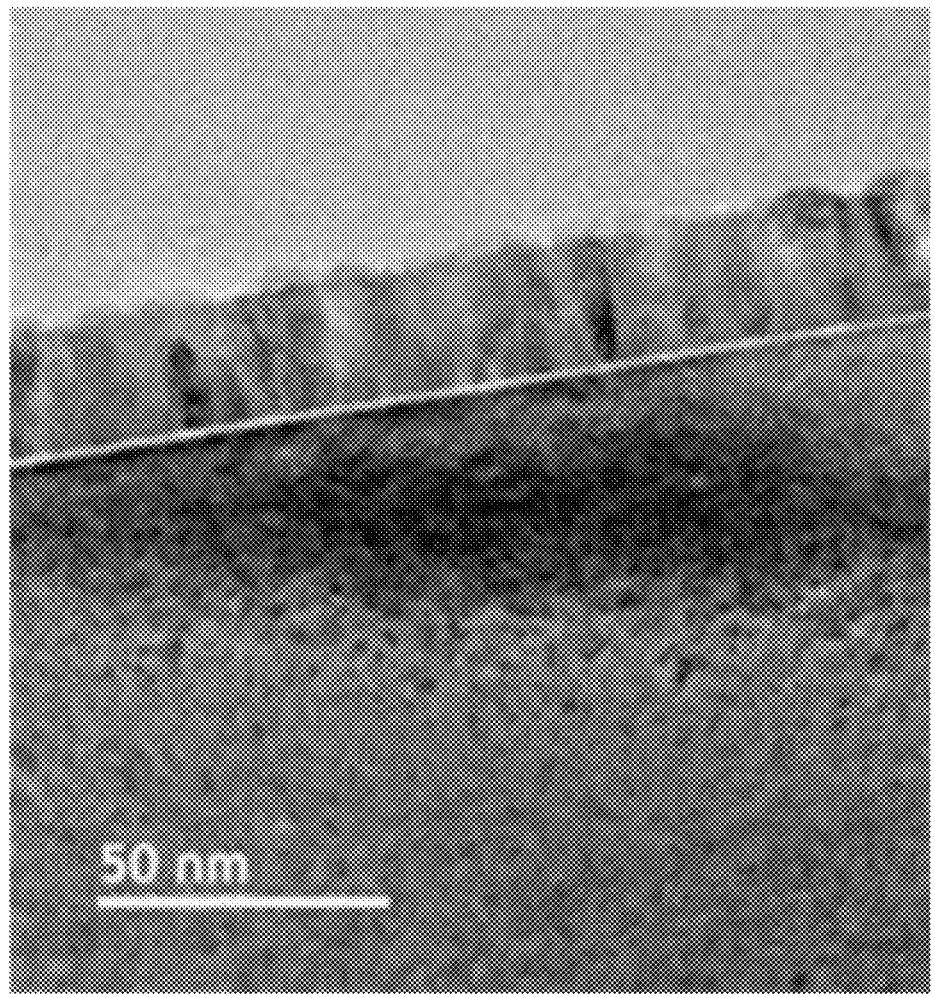
FIG. 2 is a cross-sectional transmission electron micrograph of a TiN layer grown on an oxide-coated silicon substrate by thermal atomic layer deposition.

FIG. 2 is a cross-sectional transmission electron micrograph of a TiN layer grown by thermal ALD on a Si substrate coated with native oxide. After an initial film grown in either a three-dimensional island or SK growth mode, the ALD growth of TiN is often characterized by a competitive growth of adjacent crystals with different orientations, resulting, under some circumstances, in V-shaped grains close to the nucleation layer and culminating in a columnar morphology at higher film thicknesses. As illustrated in FIG. 2, the resulting film morphology includes facetted column tops that give rise to a significant surface roughness and column boundaries having lower density relative to the grains. It will be appreciated that the column boundaries can have significantly worse diffusion barrier properties relative to the grains themselves, and may serve as paths of least resistance for transportation of undesirable contaminant through the TiN layer.

The inventors have discovered that, when an initial portion of a TiN layer is formed on the non-metal surface by exposing the substrate to Ti and/or N precursors at relatively low pressures, e.g., less than 1 torr, an initial three-dimensional or SK growth mode can be suppressed and a layer-by-layer growth mode can be promoted in an initial stage, e.g., a nucleation stage, of the TiN deposition. Among other reasons, this may be because the local diffusion of adsorbed Ti and N precursor molecules have more time to locally diffuse and wet the substrate surface, especially a non-metal surface, with relatively low contact angles. The TiN layer grown at relatively low exposure pressures results in a layer that uniformly covers large areas of the non-metal surface without substantially forming islands, such that, the initial stages of growth tend more to favor a layer-by-layer growth mode on substrate surfaces on which ALD TiN would normally favor a three-dimensional island or SK growth mode as described above. Thus, by initiating ALD of TiN by exposing the substrate to the Ti and/or N precursors at relatively low precursor exposure pressures, e.g., less than 3 torr, the resulting initial layer may grow in a layer-by-layer mode, e.g., in the nucleation stage. A subsequent bulk stage of growth, which may proceed by exposing the substrate to the Ti and/or N precursors at the relatively high precursor exposure pressures, e.g., greater than 3 torr, may continue to proceed in a layer-by-layer mode. By employing the methods according to embodiments, some of the drawbacks of conventional ALD of TiN may be avoided, particularly when the TiN layer is formed by ALD directly on some semiconductor and/or insulating materials, particularly inorganic layers comprising Si, $SiO_2$ and/or $Si_3N_4$, which may be ordinarily be associated with an initial growth characterized by an island or SK growth mode followed by a columnar growth as described above.

Figure 3A:
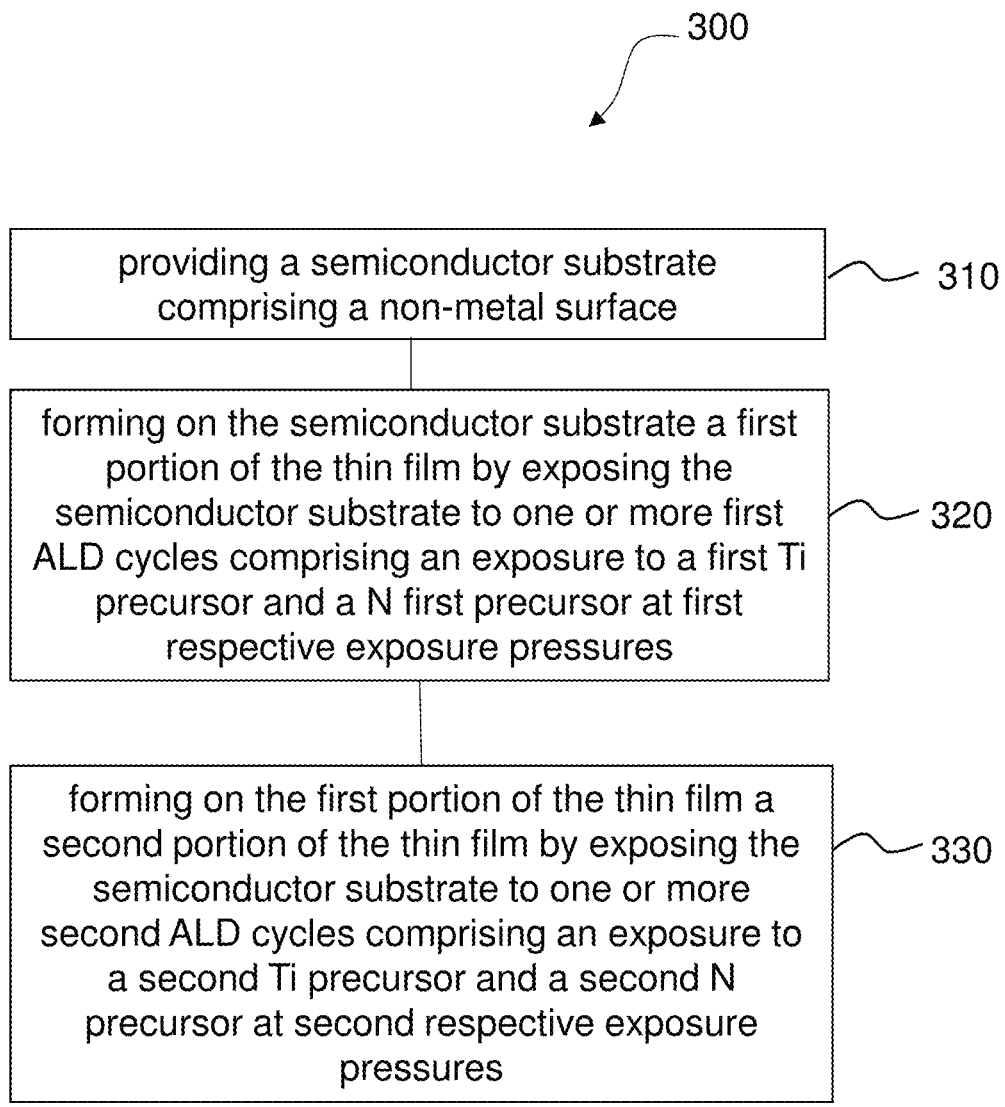
FIG. 3A is a flow chart schematically illustrating an atomic layer deposition method of forming a TiN layer by exposing a substrate to a plurality of cycles with different corresponding precursor exposure pressures, according to embodiments.
Figure 3B:
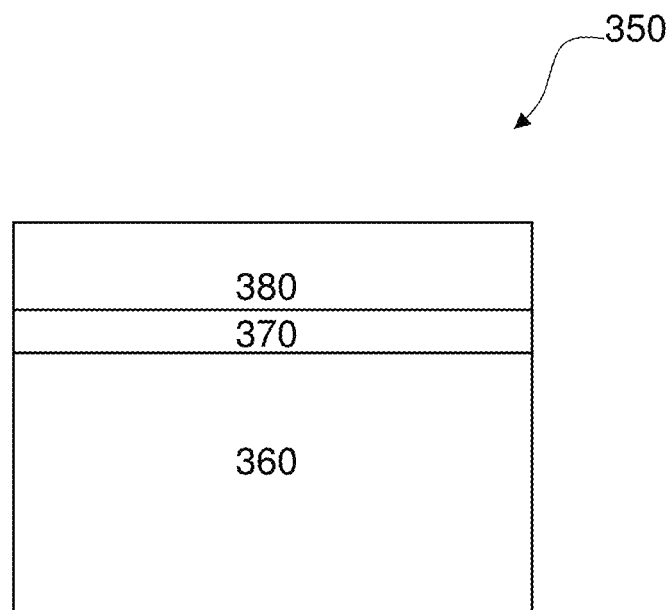
FIG. 3B schematically illustrates a cross-sectional view of a semiconductor structure comprising a TiN layer formed by an atomic layer deposition method in which a substrate is exposed to a plurality of cycles with different corresponding precursor exposure pressures, according to embodiments.

FIG. 3A is a flow chart schematically illustrating an atomic layer deposition method 300 of forming a TiN layer by exposing a substrate to a plurality of cycles with different corresponding precursor exposure pressures, according to embodiments. The resulting film may have at least two regions formed at different corresponding exposure pressures. FIG. 3B schematically illustrates a cross-sectional view of a semiconductor structure 350 comprising a TiN layer formed by an atomic layer deposition method in which a substrate is exposed to a plurality of cycles with different corresponding precursor exposure pressures, according the method illustrated in FIG. 3A. Referring to FIG. 3A, the method 300 includes providing 310 a substrate comprising a non-metal surface in a reaction chamber configured for ALD, e.g., thermal ALD. The method 300 additionally comprises an initial stage, e.g., a nucleation stage, that includes forming 320 on the substrate a first portion of the thin film by exposing the semiconductor substrate to one or more first ALD cycles each comprising an exposure to a first Ti precursor and a first N precursor at first respective exposure pressures. The method 300 further comprises latter stage, e.g., a bulk deposition stage, including forming 330 on the first portion of the thin film a second portion of the thin film by exposing the semiconductor substrate to one or more second ALD cycles each comprising an exposure to a second Ti precursor and a second N precursor at second respective exposures. The exposures to one or both of the Ti precursor and the N precursor during the one or more second ALD cycles are at higher pressures relative to corresponding exposures to one or both of the Ti precursor and the N precursor during the one or more first ALD cycles.

Referring to FIG. 3B, a cross-sectional view of a semiconductor thin film structure 350 comprising a substrate 360, which in turn comprises a non-metal surface, e.g., a dielectric and/or a semiconductor surface. A first a first portion 370 of a thin film comprising TiN is formed on the substrate 360, and a second portion 380 of the thin film is formed on the first portion 370. The first and second portions 370, 380 are formed by an atomic layer deposition method illustrated in FIG. 3A, in which the substrate 360 is exposed to first and second cycles with different corresponding precursor exposure pressures. Because the first portion 370 may be grown in a layer-by-layer growth mode in the initial stage, e.g., a nucleation stage as discussed above, at least the first portion 370 or both the first and second portions 370, 380 may be substantially free of adjacent crystals having different orientations characterized by columnar growth of V-shaped grains and the relatively high (e.g., 10% of the thickness) surface roughness. The resulting TiN layer has superior properties including one or more of relatively high conformality or step coverage, lower surface roughness, smaller average grain size, higher electrical conductivity and/or barrier characteristics relative to a comparable thin film layer formed at a single pressure during nucleation and bulk deposition stages.

As described herein and throughout the specification, it will be appreciated that the semiconductor substrate on which the TiN thin films according to embodiments can be implemented in a variety of substrates, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

According to certain embodiments, the substrate can also be implemented as a semiconductor on insulator, such as silicon on insulator (SOI), substrate. An SOI substrate typically includes a silicon-insulator-silicon structure in which the various structures described above are isolated from a support substrate using an insulator layer such as a buried $SiO_2$ layer. In addition, it will be appreciated that the various structures described herein can be at least partially formed in an epitaxial layer formed at or near a surface region.

Furthermore, the substrate can include a variety of structures formed thereon, e.g., diffusion regions, isolation regions, electrodes, vias and lines to name a few, on which any structure comprising the TiN layer according to embodiments may be formed, including topological features such as vias, cavities, holes or trenches having one or more semiconductor or dielectric surfaces. Thus, the non-metal surface on which the TiN layer according to embodiments is formed can include a semiconductor surface, e.g., a doped or undoped Si surface, and/or a dielectric surface, e.g., an interlayer dielectric (ILD) surface, a mask or a hard mask surface or a gate dielectric surface, to name a few, which can include an inorganic insulator, an oxide, a nitride, a high K dielectric, a low K dielectric, or carbon, to name a few dielectric materials.

As described herein and throughout the specification, a reactor chamber refers to any reaction chamber including a single wafer processing reaction chamber or a batch wafer processing reaction chamber that is suitably configured for thermal atomic layer deposition (ALD). In a thermal ALD reactor, the substrate may be placed on a suitable substrate holder, such as a susceptor or a carrier boat. The substrate may be directly heated by conduction through a heated susceptor, or indirectly heated by radiation from a radiation source such as a lamp or by convection through a heated chamber wall.

Generally in an ALD process, reactants or precursors, e.g., oxidizing and reducing reactants, are alternatingly introduced into a reaction chamber having disposed therein a substrate. The introduction of one or more reactants or precursors may be in turn be alternated with a purge and/or a pump out process for removing excess reactants or precursors from the reaction chamber. The reactants may be introduced into the reaction chamber under a condition over a suitable period of time such that the surface of the substrate becomes at least partly saturated with the precursors or reactants and/or a reaction product of the reactants. Excess or residual precursors or reactants may then be removed from the substrate, such as by being purged and/or pumped out of the reaction chamber. A pump out process may be performed by a suitable vacuum pumping process and a purge step may be performed by introducing a non-reactive or an inert gas, e.g., nitrogen or a noble gas, into the reaction chamber. In the context of layers formed by thermal ALD in examples hereinbelow, there are generally two categories of precursors or reactants, namely nitrogen (N) precursors and titanium (Ti) precursors.

In the following, with reference to FIG. 4, example implementations of the method 300 (FIG. 3A) of forming by ALD, e.g., thermal ALD, a thin film comprising TiN having at least two regions formed by exposing a substrate to a plurality of cycles with different corresponding precursor exposure pressures, according to embodiments.

Atomic Layer Deposition of TiN by Exposing Substrate to a Plurality of Cycles with Different Corresponding Precursor Exposure Pressures Referring back to FIG. 3A, after providing 310 the substrate (substrate 360 in FIG. 3B) comprising a non-metal surface in the reaction chamber, the method 300 proceeds to forming 320 by atomic layer deposition (ALD), e.g., thermal ALD, on the non-metal surface a first portion of the thin film by exposing the semiconductor substrate to one or more first ALD cycles, followed by a second portion of the thin film by exposing the semiconductor substrate to one or more second ALD cycles. In the following, exposure pressures applied during the first and second ALD cycles are described diagrammatically.

Figure 4:
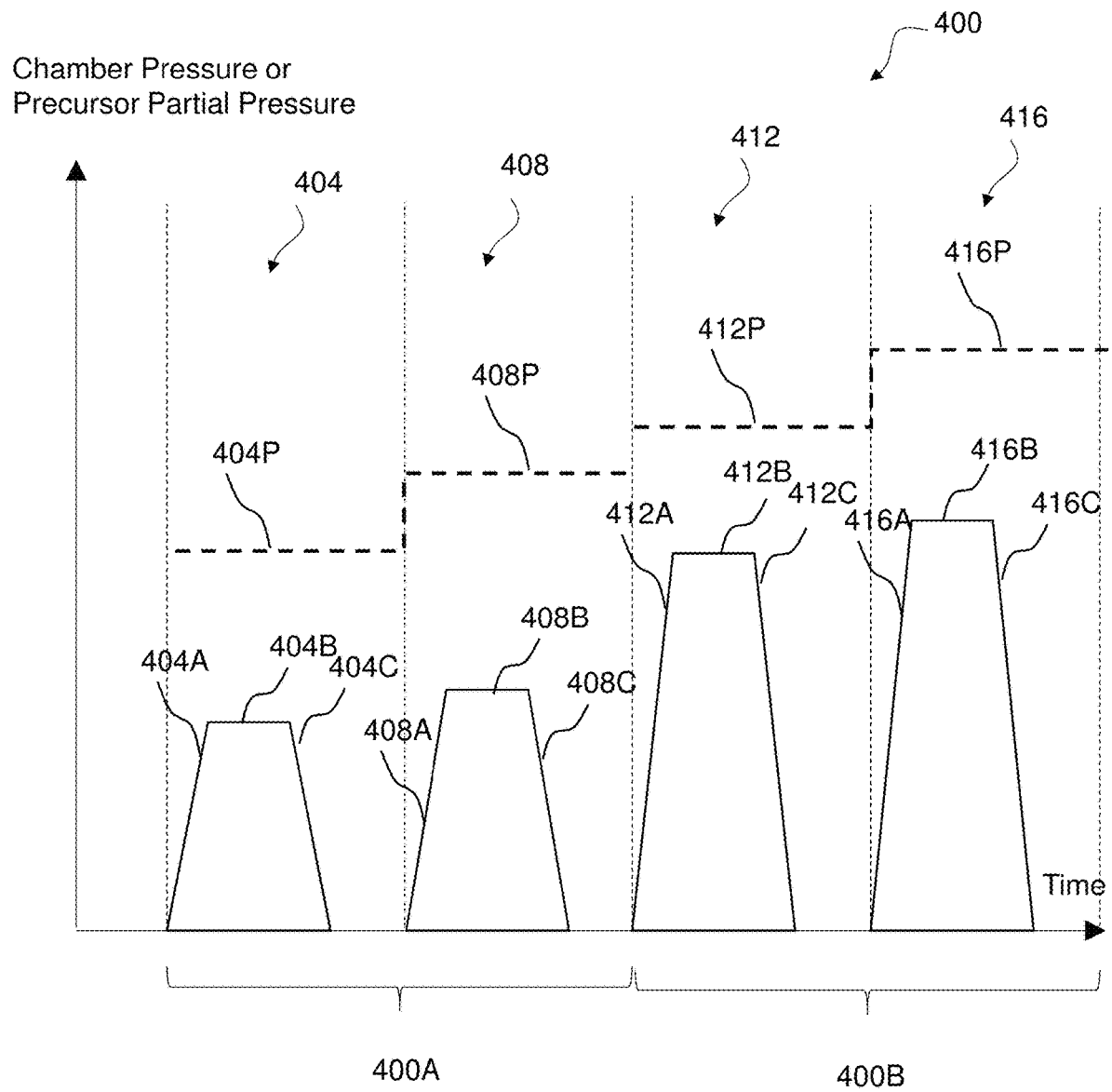
FIG. 4 schematically illustrates pressure traces of different cycles of an atomic layer deposition method in which a substrate is exposed to a plurality of cycles with different corresponding precursor exposure pressures, according to embodiments.

FIG. 4 diagrammatically illustrates pressure traces corresponding to exposures of the substrate to Ti and N precursors during a first cycle 400A or stage, e.g., a nucleation stage, for forming the first portion 370 (FIG. 3B) of the thin film and the second cycle 400B or stage, e.g., a bulk growth stage, for forming the second portion 380 (FIG. 3B) of the thin film, according to various embodiments. Referring to FIG. 4, a first portion of the thin film is formed by exposing the semiconductor substrate to one or more first ALD cycles 400A each comprising one or more exposures 404 or exposure pulses to a partial pressure of a first Ti precursor and one or more exposures 408 or exposure pulses to a partial pressure of a first N precursor. A second portion of the thin film is formed by exposing the semiconductor substrate to one or more second ALD cycles 400B each comprising one or more exposures 412 or exposure pulses to a partial pressure of a second Ti precursor and one or more exposures 416 or exposure pulses to a partial pressure of second N precursor.

As schematically depicted, each of the exposures 404 to a first Ti precursor, 408 to a first N precursor, 412 to a second Ti precursor and 416 to a second N precursor may have different partial pressure regimes, including a corresponding partial pressure rise regime 404A, 408A, 412A and 416A, a main exposure regime 404B, 408B, 412B and 416B, and a partial pressure fall regime 404C, 408C, 412C and 416C. Each of the partial pressure rise regimes 404A, 408A, 412A and 416A may correspond, for example, the respective precursor being introduced into the reaction chamber. Each of the main exposure regimes 404B, 408B, 412B and 416B may correspond to a period during which the amount of the respective precursor in the reaction chamber is relatively constant. The relative constant amount of the respective precursor may be maintained, e.g., using a pressure transducer or a throttle valve. Each of the partial pressure fall regime 404C, 408C, 412C and 416C may correspond, for example, to a regime when the respective precursor is being purged or pumped out of the reaction chamber.

Still referring to FIG. 4, it will be appreciated that, in some implementations, the precursors may be pumped out and/or purged out after each exposure. In some implementations where the precursor may be pumped out without being purged, the reaction chamber pressure may be substantially represented by the partial pressures of the respective precursors, and the pressures traces of the exposures 404, 408, 412 and 416 may substantially represent the reaction chamber pressures or the precursor partial pressures during the respective exposures. In some implementations where the precursor is purged out with an inert gas without being pumped out, the reaction chamber pressure may be represented by total reaction chamber pressures 404P, 408P, 412P and 416P corresponding to the exposures 404, 408, 412 and 416, where the total reaction chamber pressures result from a mixture of the respective precursors and an inert gas.

In practice, a combination of pumping and purging may be used for higher throughput and improved film quality. In these implementations, the substrate may be subjected to partial pressures of the first Ti precursor, the first N precursor, the second Ti precursor and the second N precursor, while measuring total pressures 404P, 408P, 412P and 416P including during purging and pumping. In some embodiments, the total chamber pressure may be kept relatively constant throughout a given precursor exposure or exposure pulse while pumping power is adjusted using a pressure transducer and replacing the removed precursor with an inert gas. In these implementations, one or more first ALD 400A cycles for forming the first portion (370 in FIG. 3B) may each comprise one or more exposures 404 to a partial pressure of a first Ti precursor (while the measured parameter may be a total reaction chamber pressure 404P), and one or more exposures 408 to a partial pressure of a first N precursor (while measured parameter may be a total reaction chamber 408P). Similarly, one or one or more second ALD cycles 400B for forming the second portion (380 in FIG. 3B) may each comprise one or more exposures 412 to a partial pressure of a second Ti precursor (while the measured parameter may be a total pressure 412P) and one or more exposures 416 to a partial pressure of a second N precursor (while the measured parameter may be a total pressure 416P).

According to various embodiments, during an exposure to a precursor, the measured total reaction chamber pressure may be proportional to the partial pressure of the precursor. Thus, the total pressures 412P and 416P that are higher relative total pressures 404P and 408P, respectively, correspond to higher partial pressures of the second Ti precursor and the second N precursor relative to partial pressures of the first Ti precursor and the first N precursor, respectively. However, embodiments are not so limited and in other embodiments, the total pressures 412P and 416P that are higher relative total pressures 404P and 408P, respectively, may correspond to the same or lower partial pressures of the second Ti precursor and the second N precursor relative to partial pressures of the first Ti precursor and the first N precursor, respectively.

Referring back to the illustrated method 300 in FIG. 3A, one or both of exposure pressures of the second Ti precursor and the second N precursor during one or more second ALD cycles of the latter, e.g., a bulk deposition phase are higher relative to corresponding one or both of exposure pressures of the first Ti precursor and the first N precursor during one or more first ALD cycles of the initial, e.g., a nucleation phase. In some embodiments, the exposure pressures may be partial pressures of the precursors or total pressures of the reaction chambers. Thus, in various embodiments, in reference to FIG. 4, one or both of the exposure 412 to the second Ti precursor and the exposure 416 to the second N precursor may be at higher partial pressures and/or a higher total reaction chamber pressures relative to the corresponding one or both of the exposure 404 to a the first Ti precursor and the exposure 408 to the first N precursor, respectively.

Still referring to FIG. 4, in various embodiments, the corresponding partial or total pressures between corresponding exposures to Ti and N precursors during the first and second cycles 400A and 400B may be corresponding partial or total pressures during any one of partial pressure rise regimes 404A, 408A, 412A and 416A, main exposure regimes 404B, 408B, 412B and 416B, and partial pressure fall regimes 404C, 408C, 412C and 416C. For example, the exposures 412, 416 to one or both of the second Ti precursor and the second N precursor during the main exposure regimes 412B and 416B, respectively, during the second ALD cycle 400B, may be at higher total or partial pressures relative to the exposures 404, 408 to one or both of the first Ti precursor and the first N precursor during the main exposure regimes 404B and 408B, respectively, during the first ALD cycle 400A. In various other embodiments, the corresponding partial or total pressures between corresponding exposures to Ti and N precursors during the first and second cycles 400A and 400B may be corresponding average, mean or peak partial or total pressures during the exposures 404, 408, 412 and 416.

Still referring to FIG. 4, in the illustrated embodiment, the total and/or partial pressures during the exposure 404 to the first Ti precursor and the exposure 408 to the first N precursor are different, and the total and/or partial pressures during the exposure 412 to the second Ti precursor and the exposure 416 to the second N precursor are different. However, embodiments are not so limited, and in some embodiments, the total and/or partial pressures during the exposure 404 to the first Ti precursor and the exposure 408 to the first N precursor may be kept constant, and/or the total and/or partial pressures during the exposure 412 to the second Ti precursor and the exposure 416 to the second N precursor may be kept constant.

Still referring to FIG. 4, each of the total pressures during the exposure 404 to the first Ti precursor and the exposure 408 to the first N precursor, which may be the same or different, may be 0.01-0.2 torr, 0.2-0.4 torr, 0.4-0.6 torr, 0.6-0.8 torr, 0.8-1.0 torr, 1.0-1.5 torr, 1.5-2.0 torr, 2.0-2.5 torr, 2.5-3.0 torr, or a pressure in range defined by any of these values. Each of the total pressures during the exposure 412 to the second Ti precursor and the exposure 416 to the second N precursor, which may be the same or different, may be 3.0-4.0 torr, 4.0-5.0 torr, 5.0-6.0 torr, 6.0-7.0 torr, 7.0-8.0 torr, 8.0-9.0 torr, 9.0-10.0 torr, 10.0-11.0 torr, 11.0-12.0 torr, or a pressure in range defined by any of these values. A ratio of the total pressure (measured in torr) of the reaction chamber during the exposure 412 to the second Ti precursor and the exposure 404 to the first Ti precursor may be 2-5, 5-10, 10-20, 20-50, 50-100, or in a range defined by any of these values. Similarly, a ratio of the total pressure of the reaction chamber during the exposure 416 to the second N precursor and the exposure 408 to the first N precursor may be 2-5, 5-10, 10-20, 20-50, 50-100, or in a range defined by any of these values. In each of the exposures 404, 408, 412 and 416, the respective Ti or N precursor can make up 1-2%, 2-5%, 5-10%, 10-20%, 20-50%, 50-100% of the total amount of gas molecules in the reaction chamber, or a percentage in a range defined by any of these values.

Still referring to FIG. 4, according to various embodiments, the total pressure or the partial pressure during the exposure 404 to the first Ti precursor and the exposure 408 to the first N precursor, in conjunction with the flow rates of the respective precursors and an inert gas and the pumping power of the reaction chamber, are controlled such that the deposition rate during the first cycle 400A or stage is between 0.10-0.20 Å/cycle, 0.20-0.30 Å/cycle, 0.30-0.40 Å/cycle, 0.40-0.50 Å/cycle, 0.50-0.60 Å/cycle or a value in a range defined by any of these values, per cycle including an exposure 404 to the first Ti precursor and an exposure 408 to the first N precursor. The total pressure or the partial pressure during the exposure 412 to the second Ti precursor and the exposure 416 to the second N precursor, in conjunction with the flow rates of the respective precursors and an inert gas and the pumping power of the reaction chamber are controlled such that the deposition rate during the second cycle 400B or stage is 0.20-0.30 Å/cycle, 0.30-0.40 Å/cycle, 0.40-0.50 Å/cycle, 0.50-0.60 Å/cycle, 0.60-0.70 Å/cycle, 0.60-0.70 Å/cycle, 0.70-0.80 Å/cycle or a value in a range defined by any of these values, per cycle including an exposure 404 to the first Ti precursor and an exposure 408 to the first N precursor. A ratio of the deposition rate per cycle during the second cycle 400B to the deposition rate per cycle during the first cycle 400A may be 1-1.5, 1.5-2.0, 2.5-3.0, or a ratio in a range defined by any of these values.

The inventors have found that various technical advantages of TiN thin films disclosed herein may be realized when each of forming 320 (FIG. 3A) the first portion 370 (FIG. 3B) and forming 330 (FIG. 3A) the second portion 380 (FIG. 3B) of the thin film comprising TiN comprises exposing a semiconductor substrate to 1-25 cycles, 26-50 cycles, 50-100 cycles, 100-200 cycles, 200-300 cycles, 300-400 cycles, 400-500 cycles, 500-600 cycles, or a value in a range defined by any of these values, of the first cycles 400A (FIG. 4) and second cycles 400B (FIG. 4), respectively. According to various embodiments, a ratio of the number of second cycles to the number of first cycles can be greater than 1, 2, 5 or 10 or a ratio in a range defined by any of these values, or smaller than 1, 0.5, 0.1 or 0.1 or a ratio in a range defined by any of these values. The overall thickness of the thin film comprising TiN including the first portion 370 (FIG. 3B) and the second portion 380 (FIG. 3B) can have a combined stack thickness that does not exceed about 25 nm, 20 nm, 15 nm, 10 nm, 7 nm, 4 nm, 2 nm, or having a value in a range defined by any of these values. A thickness ratio between the first portion 370 (FIG. 3B) and the second portion 380 (FIG. 3B) can be about 1:20-1:10, 1:10-1:5, 1:5-1:2, 1:2-1:1, 1:1-2:1, 2:1-5:1, 5:1-10:1, 10:1-20:1, or a ratio in a range defined by any of these values. It will be appreciated that in some embodiments, the first portion 370 (FIG. 3B) may be relatively thinner, e.g., when higher conformality may be more important compared to lower film roughness, while in other embodiments, the second portion 380 (FIG. 3B) may be relatively thinner, e.g., when lower film roughness may be more important compared to higher conformality.

Still referring to FIG. 4, each of the exposure 404 of the substrate to the first Ti precursor and the exposure 412 of the substrate to the second Ti precursor is such that the surface of the substrate is substantially or partly saturated with the first Ti precursor or the second Ti precursor, respectively. After each of the exposure 404 of the substrate to the first Ti precursor and the exposure 412 of the substrate to the second Ti precursor, excess or residual first and/or second Ti precursors or their reaction products that do not remain adsorbed or chemisorbed on the surface of the substrate may be pumped and/or purged out.

Similarly, each of the exposure 408 of the substrate to the first N precursor and the exposure 416 of the substrate to the second N precursor is such that the substrate is substantially or partly saturated with the first N precursor or the second N precursor, respectively. After each of the exposure 408 of the substrate to the first N precursor and the exposure 416 of the substrate to the second N precursor, excess or residual first and/or second N precursors or their reaction products that do not remain adsorbed or chemisorbed on the surface of the substrate may be pumped and/or purged out. Subjecting the substrate to one or more exposures to the first Ti precursor and one or more exposures to the first N precursor may form about a monolayer or less per cycle of TiN. Similarly, subjecting the substrate to one or more exposures to the second Ti precursor and one or more exposures to the second N precursor may form about a monolayer or less per cycle of TiN.

In some embodiments, the exposure 404 to the first Ti precursor, the exposure 408 to the first N precursor, the exposure 412 to the second Ti precursor and/or the exposure 416 to the second N precursor may be performed a plurality of times in sequence prior to introduction of the other precursor. For example, advantageously, under some circumstances, exposing the substrate to a Ti precursor and/or a N precursor more than once may result in a higher level of surface saturation e.g., when substantial stearic hindrance effect exists.

Still referring to FIG. 4, it will be appreciated that the relative order of exposures to a first Ti precursor and to a first N precursor may be selected depending on competing circumstances. In some implementations, the first Ti precursor may advantageously be the first precursor the substrate surface is exposed to. For example, one or more direct exposures of a Si surface to the first Ti precursor may lead to formation of one or more monolayers of TiSi and prevent formation of SiN, which may in turn be advantageous for lowering contact resistance between the underlying Si and the TiN layer formed thereover. However, in some other implementations, the first N precursor may advantageously be the first precursor the substrate is exposed to. For example, by directly exposing a Si surface to the first N precursor, one or more monolayers of SiN may be intentionally formed, which may be advantageous for improving barrier characteristics of the stack.

It will be appreciated that in various embodiments, the frequency and repetition of the exposures of the substrate to the first Ti reactant and/or the first N precursor in each of the first cycles 408A, and to the second Ti reactant and/or the second N precursor in each of the second cycles 408B may be varied to obtain a desired thickness and stoichiometry, based on various considerations including susceptibility to stearic hindrance effects of the precursors.

According to various embodiments, non-limiting examples of the first and second Ti precursors, which may be the same or different for forming first and second portions of a TiN layer according to embodiments, include titanium tetrachloride ($TiCl_4$), tetrakis(dimethylamino)titanium (TD-MAT) or tetrakis(diethylamino)titanium (TDEAT). Having same precursors for the first and second portions of the TiN may be advantageous for, e.g., being lower in cost and/or easier for process design. However, having different precursors for the first and second portions of the TiN may be advantageous for, e.g., different deposition characteristics or film quality.

According to various embodiments, non-limiting examples of the first and second N precursors, which may be the same or different for forming first and second portions of a TiN layer according to embodiments, include ammonia ($NH_3$), hydrazine ($N_2H_4$) or monomethylhydrazine ($CH_3(NH)NH_2$, "MMH"). Having same precursors for the first and second portions of the TiN may be advantageous for, e.g., being lower in cost and/or easier for process design. However, having different precursors for the first and second portions of the TiN may be advantageous for, e.g., different deposition characteristics or film quality.

According to various embodiments, non-limiting examples of the inert gas for purging may include nitrogen $N_2$ or a noble gas such as Ar or He.

Various technical advantages and benefits described herein can be realized when one or both of the first and second portions 370, 380 (FIG. 3B) of the thin film comprising TiN are formed at a substrate temperature of 350° C. to 800° C., 450° C. to 750° C., 500° C. to 700° C., 550° C. to 650° C., or in a range defined by any of these values, for instance about 600° C., according to embodiments. Keeping the temperature the same during growth of the first and second portions 370, 380 may be advantageous for throughput an ease of process control, as temperature adjustments during process may take long time.

In various embodiments, the exposure times or pulse times of each of the first and second Ti precursors and first and second N precursors can be in the range of about 0.1-1 sec., 1-10 sec., 10-30 sec., 30-60 sec., or a duration in a range defined by any of these values.

Advantageously, when the TiN layer is formed using an atomic layer deposition method in which a substrate is exposed to a plurality of cycles with different corresponding precursor exposure pressures according to various embodiments, one or both of the surface roughness and electrical resistivity can be substantially reduced to conventional TiN films including TiN films formed using other ALD processes with a single pressure setpoint. As deposited, the thin film comprising TiN formed at according the methods described herein and having the above-indicated thicknesses and thickness ratios between the first and second portions 370, 380 (FIG. 3B) can have a root mean square (RMS) surface roughness of 3%, 4%, 5%, 6%, 7%, 8%, and 9%, or a value in a range defined by any of these values, on the basis of an average thickness of the thin film. Alternatively, as-deposited, the thin film comprising TiN having the above-indicated thicknesses and thickness ratios between the first and second portions 370, 380 (FIG. 3B) can have a RMS surface roughness value that is less than 2.5 nm, 2 nm, 1.5 nm, 1.0 nm, 0.5 nm, or a value in a range defined by any of these values.

As deposited, the thin film comprising TiN formed according to the methods described herein and having the above-indicated thickness and thickness ratios between the first and second portions 370, 380 (FIG. 3B) can have an electrical resistivity of <70 µΩ-cm, 70-100 µΩcm, 100-130µΩcm, 130-160µΩcm, 160-190µΩcm, 190-220 µΩ-cm, 220-250 µΩ-cm, 250-280 µΩ-cm, 280-310 µΩ-cm, or greater than 310 µΩ-cm, or a value in a range defined by any of these values, for instance less than about 200 µl-cm.

Figure 5:
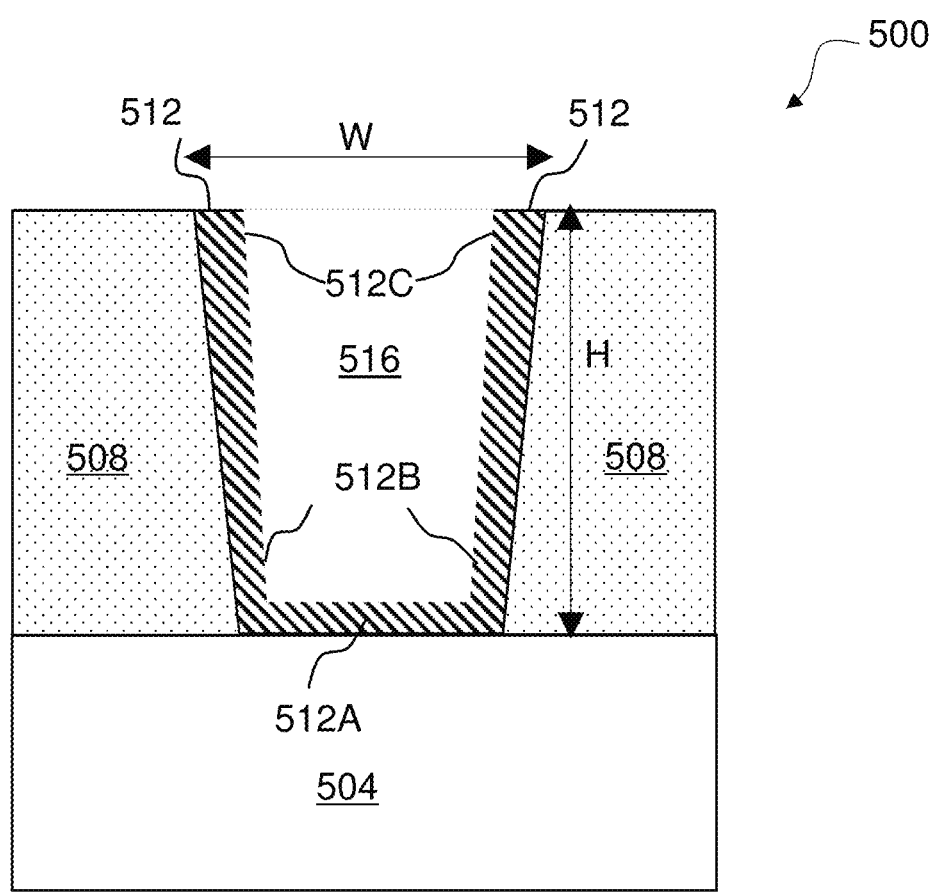
FIG. 5 schematically illustrates a cross-sectional view of a via lined with a TiN layer having different thicknesses at different portions of the via.

In addition to reduced surface roughness and electrical resistivity, the thin film comprising TiN formed according to the methods disclosed herein has high conformality when deposited in high aspect ratio structures. One measure of conformality in the context of high aspect ratio structures is referred to herein as step coverage. A high aspect ratio structure may be, e.g., a via, a hole, a trench, a cavity or a similar structure. By way of an illustrative example, FIG. 5 schematically illustrates a semiconductor structure 500 having an example high aspect ratio structure 516 formed therein, to illustrate some example metrics of defining and/or measuring conformality of thin films formed on high aspect ratio structures. The illustrated high aspect ratio structure 516 is lined with a TiN layer 512 having different thicknesses at different portions thereof. As described herein, a high aspect ratio structure has an aspect ratio, e.g., a ratio defined as a depth or height (H) divided by a width (W) at the opening region of the high aspect ratio structure 516, that exceeds 1. In the illustrated example, the high aspect ratio structure 516 is a via formed through a dielectric layer 508, e.g., an intermetal dielectric (ILD) layer, formed on a semiconductor substrate 504, such that a bottom surface of the high aspect ratio structure 516 exposes the underlying semiconductor 504. The TiN layer 512 can coat different surfaces of the high aspect ratio structure 516 with different thicknesses. As described herein, one metric for defining or measuring the conformality of a thin film formed in a high aspect ratio is referred to as step coverage. A step coverage may be defined as a ratio between a thickness of a thin film at a lower or bottom region of a high aspect ratio structure and a thickness of the thin film at an upper or top region of the high aspect ratio structure. The upper or top region may be a region of the high aspect ratio structure at a relatively small depth at, e.g., 0-10% or 0-25% of the H measured from the top of the opening. The lower or bottom region may be a region of the high aspect ratio structure at a relatively high depth at, e.g., 90-100% or 75-100% of the H measured from the top of the opening. In some high aspect ratio structures, a step coverage may be defined or measured by a ratio of thicknesses of the thin film 512A formed at a bottom surface to the thin film 512C formed at upper or top sidewall surfaces of the high aspect ratio structure. However, it will be appreciated that some high aspect ratio structures may not have a well-defined bottom surface or a bottom surface having small radius of curvature. In these structures, a step coverage may be more consistently defined or measured by a ratio of thicknesses of the thin film 512B formed at a lower or bottom sidewall surface to the thin film 512C formed at an upper or top sidewall surfaces of the high aspect ratio structure.

As described above, the thin film comprising TiN formed according to the methods disclosed herein results in a reduced surface roughness and electrical resistivity, while also providing high conformality in high aspect ratio structures. According to various embodiments, high aspect ratio structures having an aspect ratio exceeding 1, 2, 5, 10, 20, 50, 100, 200 or a value in a range defined by any of these values may be conformally coated with TiN films according to embodiments with a step coverage as defined herein that exceeds 70%, 80%, 90%, 95%, or has a value in a range defined by any of these values.

Figure 6:
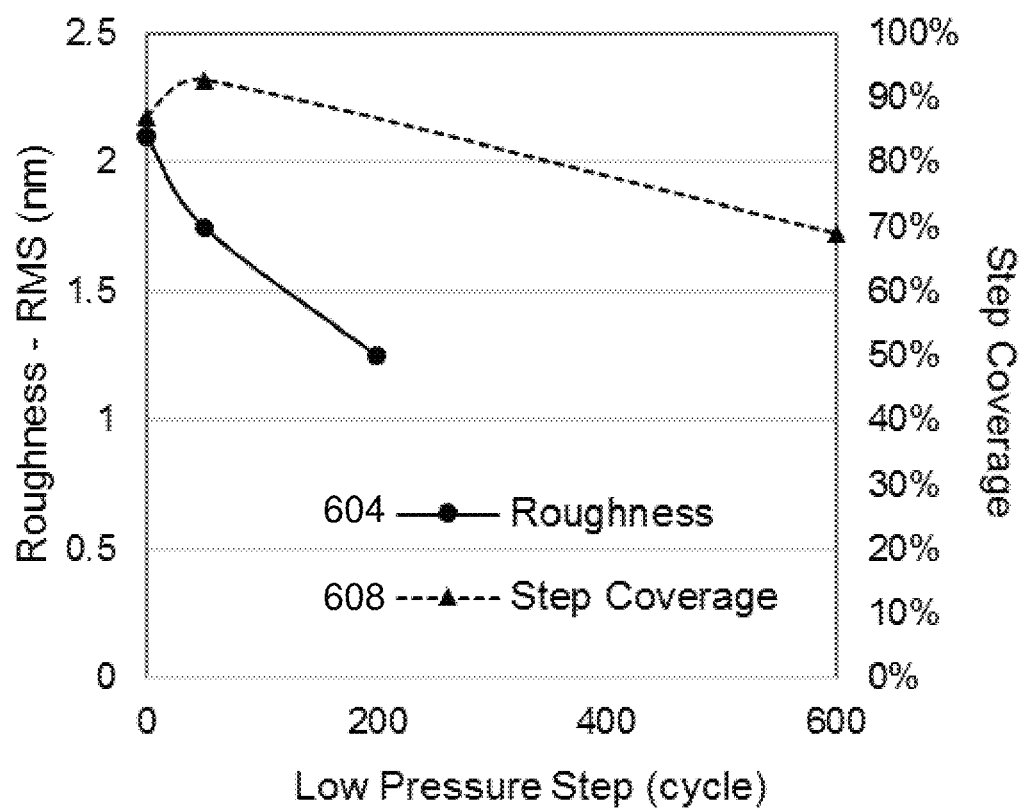
FIG. 6 is a graph showing experimentally measured surface roughness and step coverage trends as functions of thickness for TiN layers formed by an atomic layer deposition method in which a substrate is exposed to a plurality of cycles with different corresponding precursor exposure pressures, according to embodiments.

Physical Characterization of TiN Formed by Exposing Substrate to a Plurality of Cycles with Different Corresponding Precursor Exposure Pressures FIG. 6 is a graph illustrating experimentally measured root mean square (RMS) surface roughness trend 604 and step coverage trend 608 as functions of the number of first cycles of exposures to Ti and N precursors at a relatively low chamber pressure of 0.5 torr, out of a total of 600 combined first cycles (e.g., nucleation stage) and second cycles (e.g., bulk deposition stage). The second cycles of exposures to Ti and N precursors were at a relatively high chamber pressure of 5 torr. Each experimental data point in FIG. 6 was taken from a TiN film grown on a native $SiO_2$-coated Si substrate for surface roughness measurements, and a TiN film grown in a via formed in $SiO_2$ and having about 40:1 aspect ratio. The measured deposition rates of the first and second cycles were 0.28 Å/cycle and 0.38 Å/cycle, respectively. The experimental data were measured on four different TiN films grown with 0 first cycles (0 Å)/600 second cycles (228 Å), 50 first cycles (14 Å)/550 second cycles (209 Å), 200 first cycles (56 Å)/400 second cycles (152 Å), and 600 first cycles (168 Å)/0 second cycles (0 Å). The four TiN films had total thicknesses of about 228 Å, 223 Å, 208 Å and 168 Å, respectively. As described above, the measured surface roughness values of the TiN films decrease with increasing relative number of first cycles including exposures at the relatively lower pressure. Without being bound to any theory, this may be because lower growth rate tends to allow for more surface diffusion which tends to reduce the surface roughness and promote layer-by-layer growth. The measured surface roughness values for thin films grown with 0 first cycles/600 second cycles, 50 first cycles/550 second cycles and 200 first cycles/400 second cycles were about 21 Å, 17.5 Å and 12.5 Å, respectively, corresponding to about 9%, 8% and 6% on the basis of the total thickness of the respective TiN films. In addition, as discussed above, the measured step coverage values of the TiN films were higher for the thin film grown with 0 first cycles/600 second cycles relative to the film grown with 600 first cycles/0 second cycles. Without being bound to any theory, this may be because higher pressure tends to allow for more precursors to reach the bottom of the high aspect ratio, which tends to improve step coverage. However, surprisingly, the inventors have found that, up to about 50 first cycles (8% of total number of cycles), the increasing number of first cycles actually improved the step coverage. Thus, according to some embodiments, forming the first portion of the TiN film comprises alternatingly exposing the semiconductor substrate to 1 to 50 cycles each comprising an exposure to a first Ti precursor and an exposure to a first N precursor at a relatively low exposure pressure of less than about 3 torr.

Figure 7A:
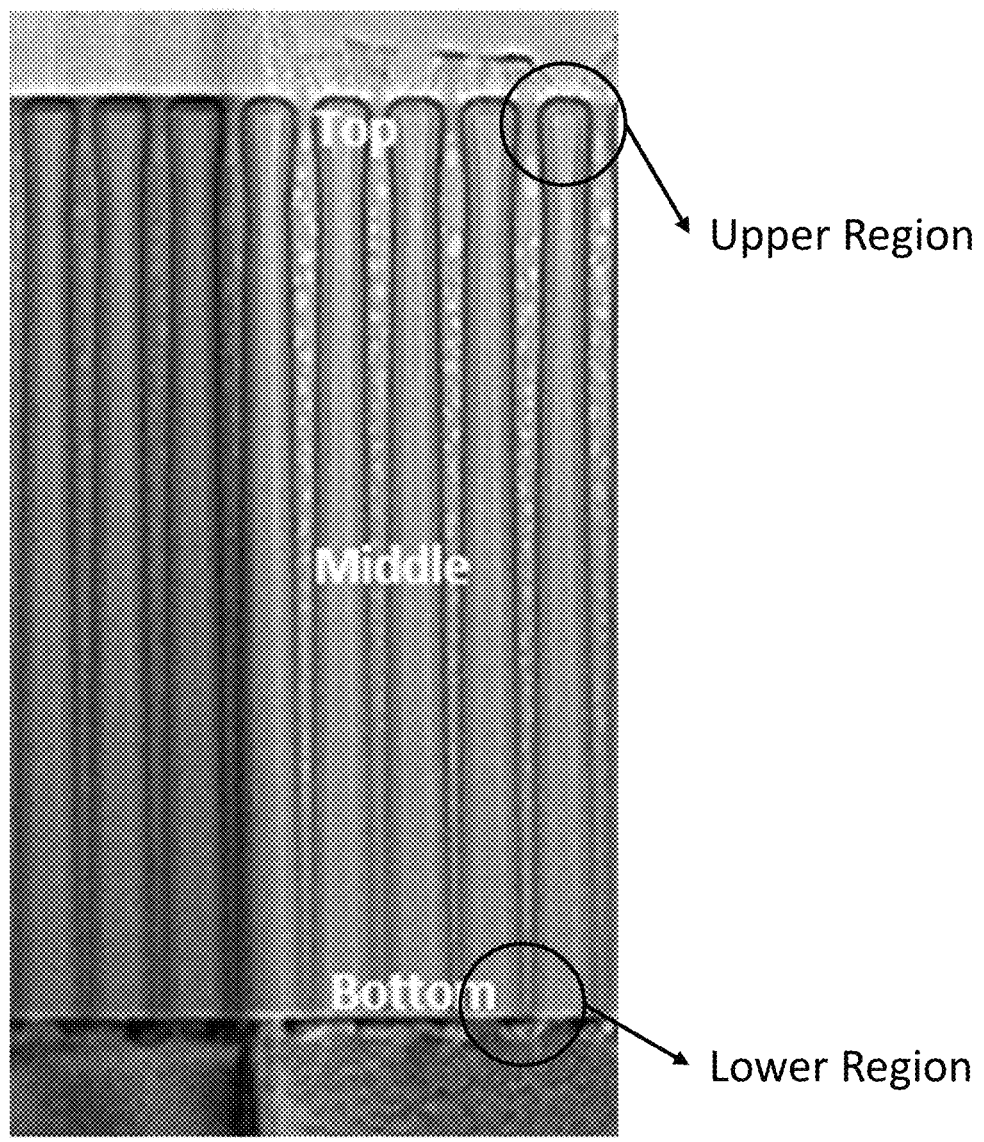
FIG. 7A is a cross-sectional transmission electron micrograph of high aspect ratio vias lined with a TiN layer formed by an atomic layer deposition method in which a substrate is exposed to ALD cycles performed at the same precursor exposure pressure.
Figure 7B:
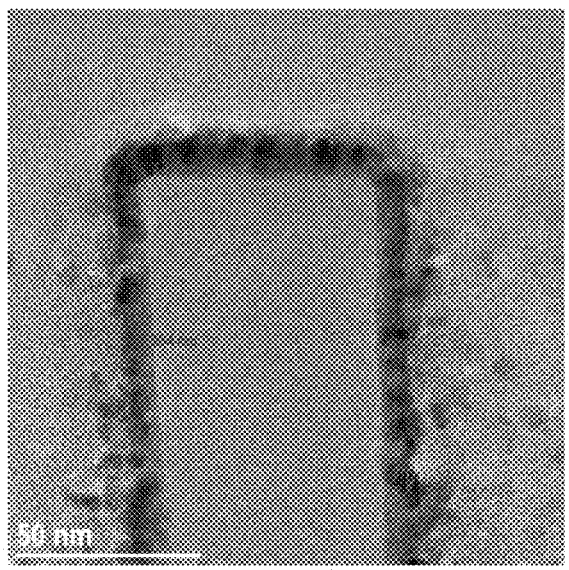
FIG. 7B is a cross-sectional transmission electron micrograph an upper region of the high aspect ratio vias shown in FIG. 7A.
Figure 7C:
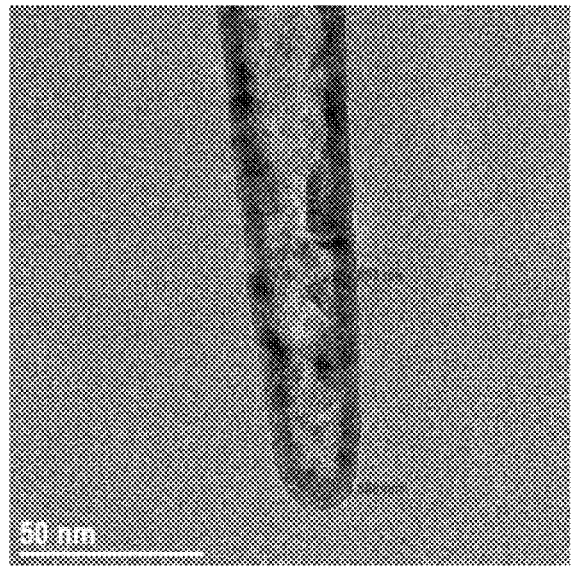
FIG. 7C is a cross-sectional transmission electron micrograph of a lower region of the high aspect ratio vias shown in FIG. 7A.
Figure 8A:
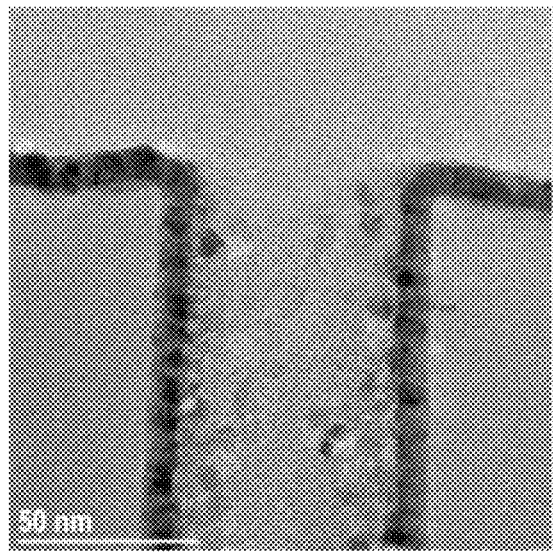
FIG. 8A is a cross-sectional transmission electron micrograph of a TiN layer formed at an upper region of a high aspect ratio via similar to that shown in FIG. 7A by an atomic layer deposition method in which a substrate is exposed to a plurality of cycles with different corresponding precursor exposure pressures, according to embodiments.
Figure 8B:
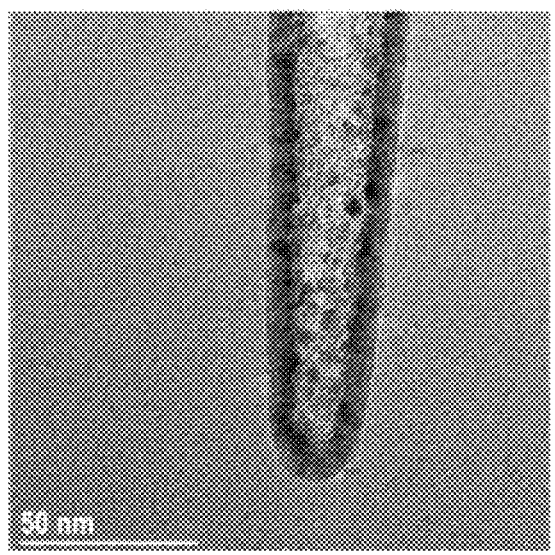
FIG. 8B is a cross-sectional transmission electron micrograph of a TiN layer formed at a lower region of the high aspect ratio via trench shown in FIG. 8A.
Figure 9:
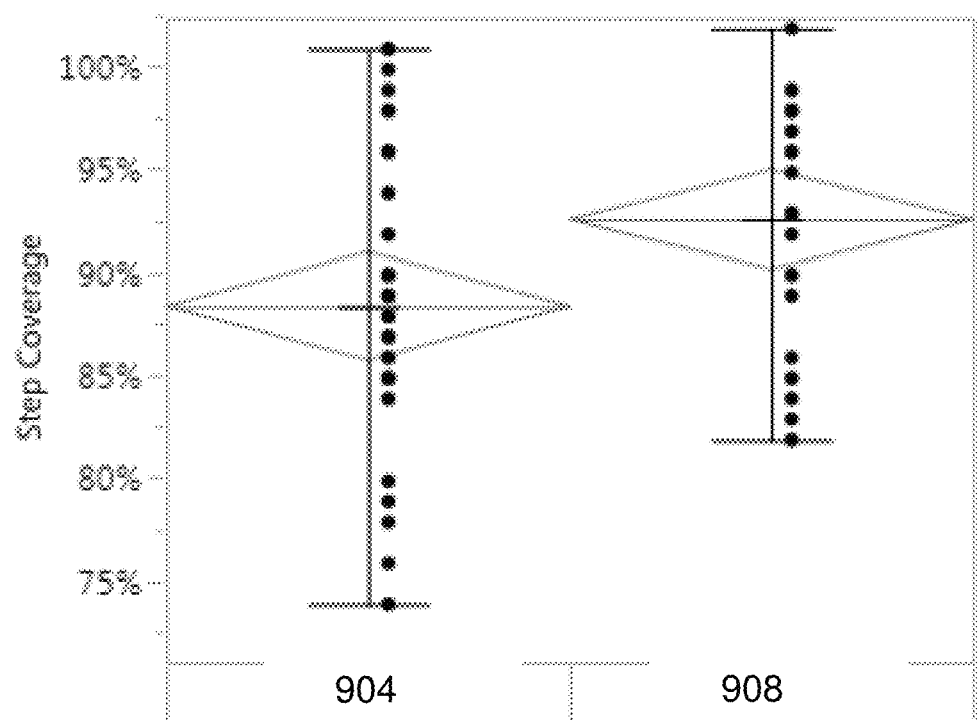
FIG. 9 is a graph showing statistical comparison of measured step coverages between a TiN layer formed by atomic layer deposition at a single exposure pressure and a TiN layer formed by atomic layer deposition at a plurality of exposure pressures, according to embodiments.

FIGS. 7A-9 illustrate further experimental comparisons between a TiN film grown by exposing a substrate to cycles with the same precursor exposure pressures and a TiN film grown by exposing a substrate to a plurality of cycles with different corresponding precursor exposure pressures, according to embodiments. FIG. 7A is a cross-sectional transmission electron micrograph of high aspect ratio vias lined with a TiN layer formed by an atomic layer deposition method in which a substrate is exposed to ALD cycles at the same precursor exposure pressure corresponding to second cycles. FIGS. 7B and 7C are transmission electron micrographs (TEMs) of a TiN film grown using only second cycles of exposures to Ti and N precursors at a relatively high chamber pressure of 5 torr. The TEMs are images of a via formed in $SiO_2$ having about 40:1 aspect ratio, taken at upper (FIG. 7B) and lower (FIG. 7C) regions of the via. In comparison, FIGS. 8A and 8B are transmission electron micrographs (TEMs) of a TiN film grown using a combination of first and second cycles of exposures to Ti and N precursors at a relatively low (0.5 torr) and high (5 torr) chamber pressures, according to embodiments. The TEMs are images of a via formed in $SiO_2$ having about 40:1 aspect ratio, taken at upper (FIG. 8A) and lower (FIG. 8B) regions of the via. FIG. 9 is a graph illustrating an experimental statistical comparison between measured step coverages 904 measured from TEM micrographs shown in FIGS. 7A-7C and measured step coverages 908 measured from TEM micrographs shown in FIGS. 8A-8B. The data points in FIG. 9 represents a ratio taken from different locations within a lower region of the via and different locations within an upper region of the via. While not readily apparent from the TEM images, the statistical comparison in FIG. 9 clearly illustrate a higher median step coverage of 93% for the TiN film deposited according to embodiments and 87% for the TiN film deposited using a single exposure pressure. In addition, the statistical spread of measured step coverage for the TiN film deposited according to embodiments is substantially smaller than that for the TiN film deposited using a single exposure pressure, indicating that the film roughness is significantly higher for the latter.

Applications

The thin films comprising TiN formed using different exposure pressures according to various embodiments disclosed herein can be used in a variety of applications, particularly where the substrate comprises a relatively high aspect ratio structure and/or a non-metal surface that can benefit from various advantageous characteristics of the TiN layer as disclosed herein. Example applications include deposition a via, a hole, a trench, a cavity or a similar structure having an aspect ratio, e.g., a ratio defined as a depth divided by a top width, that exceeds 1, 2, 5, 10, 20, 50, 100, 200 or a value in a range defined by any of these values.

Figure 10:
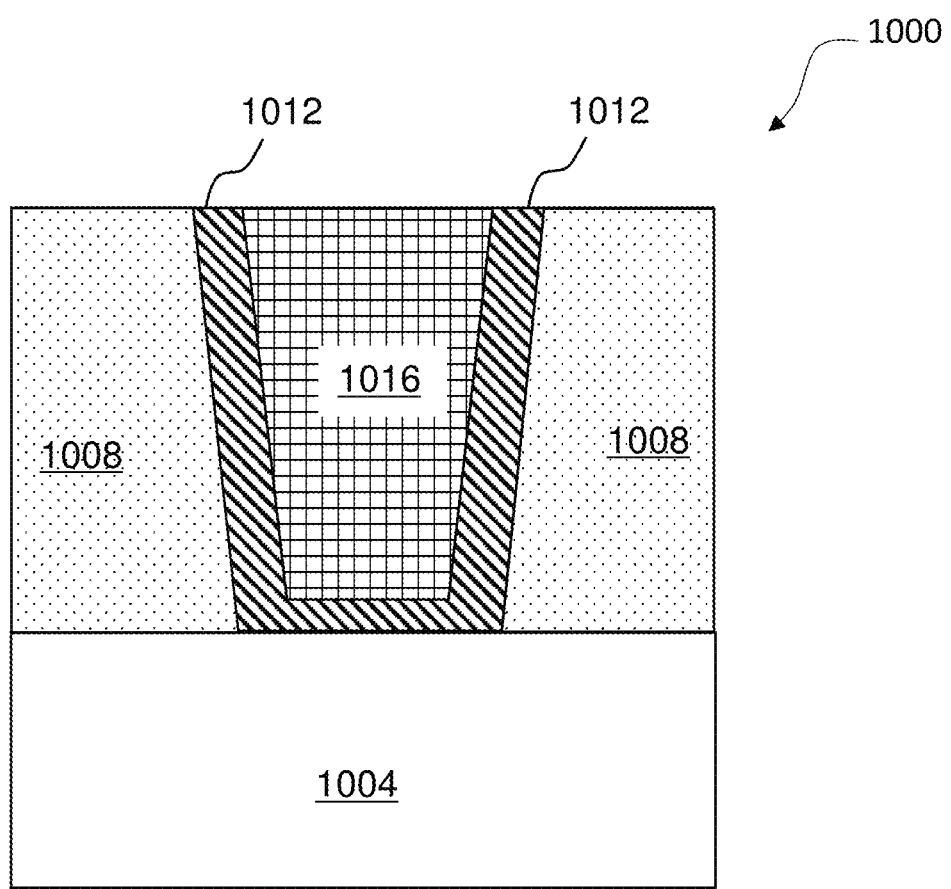
FIG. 10 schematically illustrates a cross-sectional view of a via lined with a TiN layer formed by an atomic layer deposition method in which a substrate is exposed to a plurality of cycles with different corresponding precursor exposure pressures, according to embodiments.

By way of example, FIG. 10 schematically illustrates an application in the context of a diffusion barrier for a contact structure, e.g., a source or drain contact, formed on an active semiconductor substrate region that may be heavily doped. A portion of a semiconductor device 1000 is illustrated, which includes a substrate 1004 on which a dielectric layer 1008, e.g., an interlayer or intermetal dielectric (ILD) layer comprising a dielectric material such as an oxide or nitride is formed. In order to form contacts to various regions of the substrate 1004, including various doped regions, e.g., source and drain regions, a via or a trench may be formed through the dielectric layer 1008. The via or the trench may expose various non-metal surfaces, e.g., an exposed bottom surface comprising a substrate surface, e.g., a silicon substrate surface, as well as dielectric sidewalls of the vias. The bottom and side surfaces of the via can be conformally coated with a first portion (corresponding to the first portion 370 in FIG. 3B) of the TiN layer, followed by a second portion (corresponding to the second portion 380 in FIG. 3B) formed according to various embodiments described herein. A conformal first portion may first be formed directly on inner surfaces of the via, followed by formation of a conformal second TiN layer, according various embodiments disclosed herein. Thereafter, the lined via may be filled with a metal, e.g., W, Al or Cu, to form a contact plug 1016. For example, the via may be filled with tungsten by CVD using, e.g., $WF_6$.

The barrier layer 1012 formed according to embodiments can be advantageous for various reasons. In particular, due to the conformal nature of the barrier layer 1012 formed by ALD, the propensity for a pinching off during the subsequent metal fill process may be substantially reduced. In addition, as described above, the barrier layer 1012 can provide effective hindrance of material transport thereacross, e.g., dopant (B, P) out-diffusion from the substrate 1004, as well as in-diffusion of reactants, etchants and metals (e.g., F, Cl, W or Cu) from the contact plug formation process. The barrier effect may be enhanced by reduced surface roughness and increased step coverage. Furthermore, as described above, a layer-by-layer growth mode may reduce the overall contact resistance of the barrier layer 1012. Furthermore, due to the reduced film roughness, a relatively thinner barrier layer 1012 may be formed while still accomplishing its desired barrier function, leading to further reduction in contact resistance.

Other applications of the TiN layers formed according various embodiments disclosed herein include conductive structures formed in recessed substrates (e.g., buried electrodes or lines), electrodes (e.g., DRAM capacitor electrodes or gate electrodes), metallization barriers for higher metal levels (e.g., barriers in vias/trenches for Cu contacts/lines), high aspect ratio vertical rod electrodes or vias for three-dimensional memory and through-silicon vias (TSVs), to name a few.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention. Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of forming a thin film comprising titanium nitride (TiN) by a cyclical vapor deposition process, the method comprising:

forming on a semiconductor substrate a first portion of the thin film by exposing the semiconductor substrate to one or more first cyclical vapor deposition cycles each comprising an exposure to a first Ti precursor and an exposure to a first N precursor, wherein the exposures to the first Ti precursor and the first N precursor do not overlap with each other, and wherein the first Ti precursor is exposed to the substrate in the absence of any N precursor; and forming on the first portion of the thin film a second portion of the thin film by exposing the semiconductor substrate to one or more second cyclical vapor deposition cycles each comprising an exposure to a second Ti precursor and an exposure to a second N precursor, wherein the exposures to the second Ti precursor and the first second N precursor do not overlap with each other, and wherein the second Ti precursor is exposed to the substrate in the absence of any N precursor;

wherein exposures to one or both of the second Ti precursor and the second N precursor during the one or more second cyclical vapor deposition cycles are at higher pressures relative to corresponding exposures to one or both of the first Ti precursor and the first N precursor during the one or more first cyclical vapor deposition cycles, and wherein forming the first and second portions of the thin film comprises depositing by thermal cyclical vapor deposition.

2. The method of claim 1, wherein the exposures to one or both of the first Ti precursor and the first N precursor during the one or more first cyclical vapor deposition cycles are at a reactor pressure of less than about 1 torr, and wherein the exposures to one or both of the second Ti precursor and the second N precursor during the one or more second cyclical vapor deposition cycles are at a reactor pressure greater than about 5 torr.

3. The method of claim 1, wherein the exposure to each of the second Ti precursor and the second N precursor during the one or more second cyclical vapor deposition cycles is at a higher pressure relative to the corresponding exposure to each of the first Ti precursor and the first N precursor during the one or more first cyclical vapor deposition cycles.

4. The method of claim 1, wherein forming the first portion of the thin film comprises depositing at a first deposition rate less than 0.3 Å per one of the first cyclical vapor deposition cycles comprising an exposure of the semiconductor substrate to the first Ti precursor and an exposure to the first N precursor, and wherein forming the second portion of the thin film comprises depositing at a second deposition rate greater than 0.3 Å per one of the second cyclical vapor deposition cycles comprising an exposure of the semiconductor substrate to the second Ti precursor and an exposure to the second N precursor.

5. The method of claim 1, wherein a root mean square surface roughness of the thin film is less than about 8% of a thickness of the thin film.

6. The method of claim 1, wherein forming the first portion of the thin film comprises directly exposing one or both of a semiconductor surface and an insulator surface to the one or more first cyclical vapor deposition cycles.

7. The method of claim 1, wherein forming one or both of the first portion and the second portion of the thin film comprises growing in a layer-by-layer growth mode.

8. The method of claim 1, wherein forming the first portion of the thin film comprises alternatingly exposing the semiconductor substrate to 1 to 50 first cyclical vapor deposition cycles.

9. The method of claim 1, wherein forming the first and second portions of the thin film comprises forming at a temperature between 400° C. and 600° C.

10. The method of claim 1, wherein the semiconductor substrate comprises a trench or a via comprising an inner surface comprising a non-metallic sidewall surface in a trench or a via having an aspect ratio exceeding 1, and wherein forming the thin film comprises conformally lining the inner surface, wherein a ratio of thicknesses of the thin film formed on lower 25% of a height of the trench or the via and upper 25% of the height of the trench or the via exceeds 0.9.

11. The method of claim 1, wherein an electrical resistivity of the thin film is less than about 200 μΩ-cm.

12. The method of claim 1, wherein the first Ti precursor is the same as the second Ti precursor and the first N precursor is the same as the second N precursor.

13. A method of forming a thin film comprising titanium nitride (TiN) by a cyclical vapor deposition process, the method comprising:

providing a semiconductor substrate comprising a trench or a via having an aspect ratio exceeding 1; and forming the thin film in the trench or the via by exposing the semiconductor substrate to one or more first cyclical vapor deposition cycles each comprising an exposure to a first Ti precursor and an exposure to a first N precursor to form a first portion of the thin film in the trench or the via, wherein the exposures to the first Ti precursor and the first N precursor do not overlap with each other, and wherein the first Ti precursor is exposed to the substrate in the absence of any N precursor;

and exposing the semiconductor substrate to one or more second cyclical vapor deposition cycles each comprising an exposure to a second Ti precursor and an exposure to a second N precursor to form a second portion of the thin film on the first portion of the thin film, the exposures to the second Ti precursor and the second N precursor do not overlap with each other, and wherein the second Ti precursor is exposed to the substrate in the absence of any N precursor;

wherein exposures to one or both of the first Ti precursor and the first N precursor during the one or more first cyclical vapor deposition cycles are at different pressures relative to corresponding exposures to one or both of the second Ti precursor and the second N precursor during the one or more second cyclical vapor deposition cycles, and wherein forming the first and second portions of the thin film comprises depositing by thermal cyclical vapor deposition.

14. The method of claim 13, wherein exposures to one or both of the second Ti precursor and the second N precursor during the one or more second cyclical vapor deposition cycles are at higher pressures relative to corresponding exposures to one or both of the first Ti precursor and the first N precursor during the one or more first cyclical vapor deposition cycles.

15. The method of claim 14, wherein exposures to one or both of the second Ti precursor and the second N precursor during the one or more second cyclical vapor deposition cycles are at higher pressures relative to corresponding exposures to one or both of the first Ti precursor and the first N precursor during the one or more first cyclical vapor deposition cycles by a factor of 5 or greater.

16. The method of claim 13, wherein forming the first portion comprises alternatingly exposing the semiconductor substrate to 1 to 50 first cyclical vapor deposition cycles.

17. The method of claim 13, wherein forming the first portion comprises exposing the semiconductor substrate to a first number of first cyclical vapor deposition cycles, and wherein forming the second portion comprises exposing the semiconductor substrate to a second number of second cyclical vapor deposition cycles greater than twice the first number of first cyclical vapor deposition cycles.

18. The method of claim 13, wherein a root mean square surface roughness of the thin film is less than about 8% of a thickness of the thin film.

19. The method of claim 13, wherein forming the thin film comprising TiN comprises forming by thermal cyclical vapor deposition at a temperature between 400° C. and 600° C.

20. The method of claim 13, wherein the trench or the via has an aspect ratio exceeding 5 and an inner surface comprising a non-metallic sidewall surface, and wherein forming the thin film comprises conformally lining the inner surface, wherein a ratio of thicknesses of the thin film formed on lower 25% of a height of the trench or the via and upper 25% of the height of the trench or the via exceeds 0.9.

21. The method of claim 13, wherein the first Ti precursor is the same as the second Ti precursor and the first N precursor is the same as the second N precursor.

22. The method of claim 1, wherein the exposure to the second Ti precursor is at a higher pressure relative to the exposure to the first Ti precursor, wherein the exposure to the second N precursor is at a higher pressure relative to the exposure to the first N precursor, and wherein the exposure to the first Ti precursor and the exposure to the first N precursor occur before any exposure to the second Ti precursor and any exposure the second N precursor.

23. The method of claim 13, wherein the exposure to the second Ti precursor is at a higher pressure relative to the exposure to the first Ti precursor, wherein the exposure to the second N precursor is at a higher pressure relative to the exposure to the first N precursor, and wherein the exposure to the first Ti precursor and the exposure to the first N precursor occur before any exposure to the second Ti precursor and any exposure to the second N precursor.

* * * * *

UNITED STATES PATENT AND TRADEMARK OFFICE
CERTIFICATE OF CORRECTION

| | |
|---|---|
| PATENT NO. | : 11,482,413 B2 |
| APPLICATION NO. | : 16/595945 |
| DATED | : October 25, 2022 |
| INVENTOR(S) | : Sung-Hoon Jung |

It is certified that error appears in the above-identified patent and that said Letters Patent is hereby corrected as shown below:

In the Drawings

On Sheet 3 of 11, FIG. 3A, Line 5, Reference Number 320, delete "N first" and insert --first N--.

In the Specification

In Column 11, Line 11, delete "a the" and insert --the--.

In Column 14, Lines 59-60, delete "$\mu\Omega cm$, 100-130$\mu\Omega cm$, 130-160$\mu\Omega cm$, 160-190$\mu\Omega cm$," and insert --$\mu\Omega$-cm, 100-130 $\mu\Omega$-cm, 130-160 $\mu\Omega$-cm, 160-190 $\mu\Omega$-cm,--.

In Column 14, Line 63, delete "$\mu l$-cm." and insert --$\mu\Omega$-cm.--.

In the Claims

In Column 19, Line 36, Claim 1, before "second", delete "first".

Signed and Sealed this
Seventh Day of March, 2023

Katherine Kelly Vidal
*Director of the United States Patent and Trademark Office*